(12) United States Patent
Sutton et al.

(10) Patent No.: US 10,823,955 B2
(45) Date of Patent: Nov. 3, 2020

(54) GRATING-BASED SPATIAL MODE FILTER FOR LASER SCANNING

(71) Applicant: Apple Inc., Cupertino, CA (US)

(72) Inventors: Andrew J. Sutton, Sunnyvale, CA (US); Alexander Shpunt, Portola Valley, CA (US); Yuval Gerson, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 127 days.

(21) Appl. No.: 16/182,660

(22) Filed: Nov. 7, 2018

(65) Prior Publication Data

US 2019/0278077 A1    Sep. 12, 2019

Related U.S. Application Data

(60) Provisional application No. 62/640,059, filed on Mar. 8, 2018.

(51) Int. Cl.

| | |
|---|---|
| *G03H 1/16* | (2006.01) |
| *G02B 26/10* | (2006.01) |
| *G02B 27/30* | (2006.01) |
| *H01S 5/00* | (2006.01) |
| *G03H 1/02* | (2006.01) |
| *H01S 5/125* | (2006.01) |
| *G02B 5/32* | (2006.01) |
| *G02B 26/12* | (2006.01) |

(Continued)

(52) U.S. Cl.
CPC .......... *G02B 26/106* (2013.01); *G01S 7/4812* (2013.01); *G01S 7/4817* (2013.01); *G01S 17/42* (2013.01); *G02B 5/32* (2013.01); *G02B 26/12* (2013.01); *G02B 27/30* (2013.01); *G03H 1/0248* (2013.01); *H01S 5/0071* (2013.01); *H01S 5/125* (2013.01)

(58) Field of Classification Search
CPC .... G02B 26/106; G02B 5/32; G02B 6/02085; G02B 6/106; G03H 1/0248
USPC .............. 359/211.6, 204.5, 207.7, 212.2, 15; 372/102, 24
See application file for complete search history.

(56) References Cited

U.S. PATENT DOCUMENTS

| | | |
|---|---|---|
| 7,324,286 B1 | 1/2008 | Glebov et al. |
| 2002/0071472 A1* | 6/2002 | Dickson ............... G02B 26/106 |
| | | 372/102 |

(Continued)

OTHER PUBLICATIONS

OptiGrate Corporation, "BragGratem™ Technology", 1 page, year 2015.

(Continued)

*Primary Examiner* — Audrey Y Chang
(74) *Attorney, Agent, or Firm* — Kligler & Associates Patent Attorneys Ltd

(57) ABSTRACT

An optical device includes a laser light source configured to emit a collimated beam of light, and a scanning mirror, which is configured to reflect and scan the beam of light over a predefined angular range. The optical device further includes a volume holographic grating (VHG), which is positioned to receive and reflect the collimated beam emitted by the laser light source toward the scanning mirror by Bragg reflection at a predefined Bragg-angle, while transmitting the beam reflected from the scanning mirror over a part of the angular range that is outside a cone containing the Bragg-angle.

14 Claims, 3 Drawing Sheets

(51) Int. Cl.
*G01S 17/42* (2006.01)
*G01S 7/481* (2006.01)

(56) References Cited

U.S. PATENT DOCUMENTS

| | | | |
|---|---|---|---|
| 2003/0108802 A1* | 6/2003 | Bablumyan | G02B 6/02085 430/1 |
| 2013/0207970 A1* | 8/2013 | Shpunt | G01S 7/4868 345/419 |
| 2015/0234179 A1* | 8/2015 | Shpunt | G02B 26/105 359/212.2 |
| 2015/0268399 A1 | 9/2015 | Futterer | |
| 2016/0146939 A1 | 5/2016 | Shpunt et al. | |

OTHER PUBLICATIONS

International Application # PCT/US2018/67436 search report dated Mar. 6, 2019.

* cited by examiner

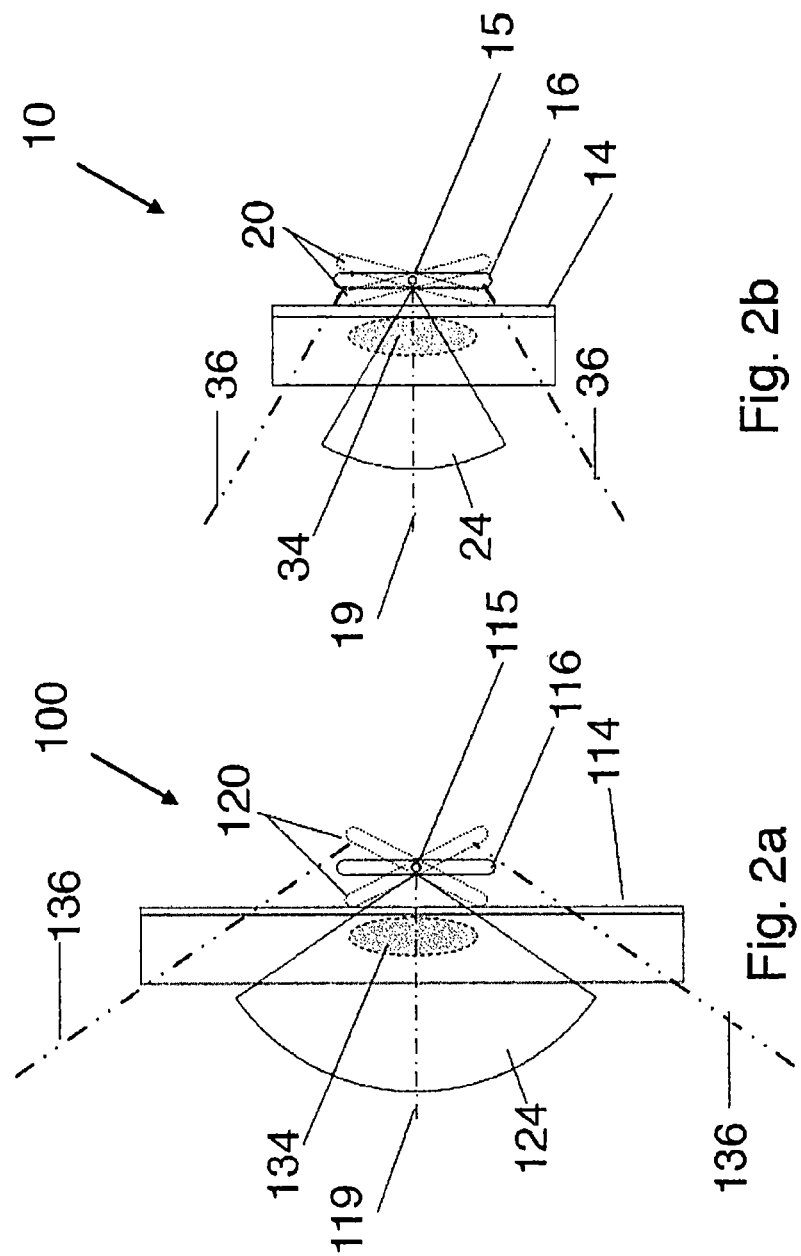

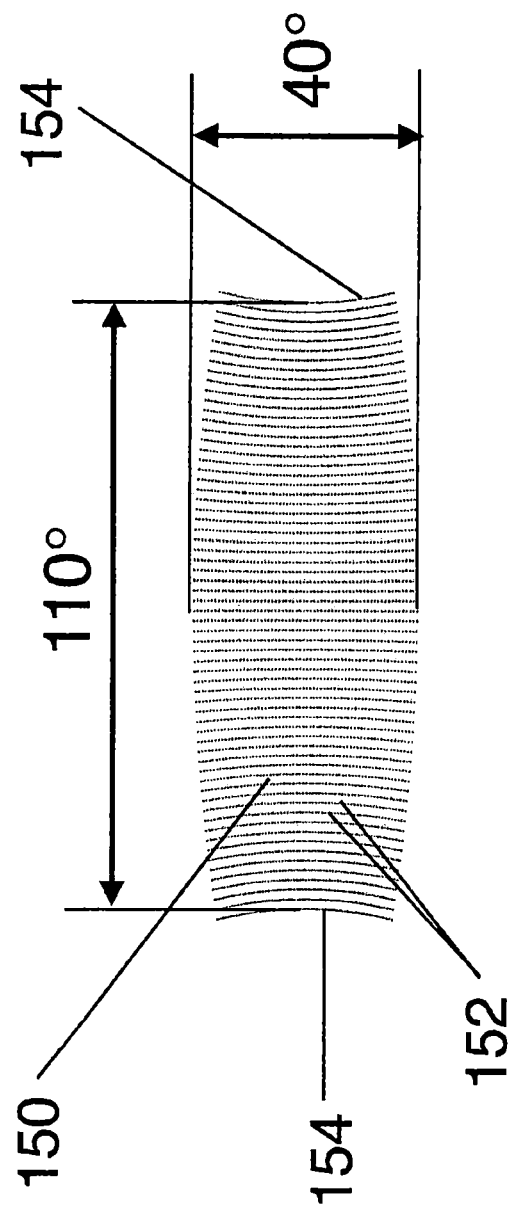

GRATING-BASED SPATIAL MODE FILTER FOR LASER SCANNING

CROSS-REFERENCE TO RELATED APPLICATION

This application claims the benefit of U.S. Provisional Patent Application 62/640,059, filed Mar. 8, 2018, which is incorporated herein by reference.

FIELD OF THE INVENTION

The present invention relates generally to optical devices, and particularly to optical scanners.

BACKGROUND

Optical scanners are used for scanning a beam of light in one or two angular dimensions. Typical architectures of optical scanners are based on a laser light source and a single-axis or double-axis scanning mirror. One common application of optical scanners is in real-time three-dimensional imagers (also known as light detection and ranging (LiDAR) sensors). LiDARs enable the remote measurement of distance (and often intensity) of each point on a target scene—so-called target scene depth—by illuminating the target scene with an optical beam and analyzing the reflected optical signal.

SUMMARY

Embodiments of the present invention that are described hereinbelow provide improved laser scanners and methods for their manufacture and use.

There is therefore provided, in accordance with an embodiment of the present invention, an optical device, including a laser light source configured to emit a collimated beam of light, and a scanning mirror, which is configured to reflect and scan the beam of light over a predefined angular range. The optical device further includes a volume holographic grating (VHG), which is positioned to receive and reflect the collimated beam emitted by the laser light source toward the scanning mirror by Bragg reflection at a predefined Bragg-angle, while transmitting the beam reflected from the scanning mirror over a part of the angular range that is outside a cone containing the Bragg-angle.

In an embodiment, the optical device includes a detector, which is configured to receive and sense the light that is returned from a scene through the VHG onto the scanning mirror, such that the returned light reflected by the scanning mirror reflects from the VHG by Bragg reflection toward the detector.

In a further embodiment, the optical device includes control circuitry, which is coupled to drive the laser light source and the scanning mirror and to receive a signal output by the detector in response to the reflected light impinging on the detector, and which is configured to map the scene responsively to the signal.

In an embodiment, the collimated beam of light includes pulses of light, and the control circuitry is configured to determine a distance to the target scene responsively to a time-of-flight of the pulses.

In another embodiment, an apex angle of the cone does not exceed 2°.

In a further embodiment, the VHG is formed on a substrate and extends over only an area of the substrate where the collimated beam impinges on the substrate. In yet another embodiment, the VHG is apodized.

There is also provided a method for optical scanning, including directing a collimated beam of light from a laser source toward a volume holographic grating (VHG), which reflects the beam at a predefined Bragg-angle toward a scanning mirror, and reflecting and scanning the collimated beam of light by the scanning mirror over a predefined angular range toward the VHG, which transmits the beam reflected from the scanning mirror over a part of the angular range that is outside a cone containing the Bragg-angle.

The present invention will be more fully understood from the following detailed description of the embodiments thereof, taken together with the drawings in which:

BRIEF DESCRIPTION OF THE DRAWINGS

FIGS. 2a-b are schematic top views of two optical devices, in accordance with embodiments of the invention; and FIG. 3 is a schematic representation of a field-of-view (FOV) of an optical device, in accordance with an embodiment of the invention.

DETAILED DESCRIPTION OF EMBODIMENTS

Figures 1A, 1B:
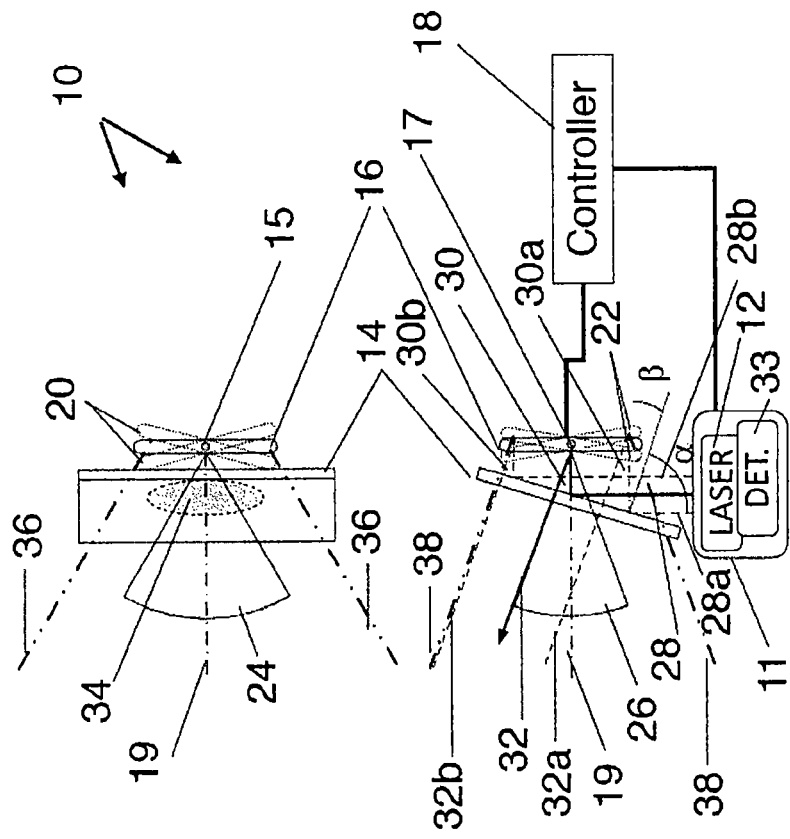
FIGS. 1a-b are schematic top and side views, respectively, of an optical device, in accordance with an embodiment of the invention.

An optical scanner projects and scans a beam from a light source across a one- or two-dimensional angular space. In a case where the optical scanner is used in a LiDAR-system, the beam is projected to a target scene, and the beam reflected from the scene is received by the scanner and forwarded to a radiation detector adjacent to the light source. Optical scanners are commonly based on a combination of a laser light source and a single-axis or double-axis scanning mirror. Two different optical architectures are commonly used for these scanners:

1. In the first architecture, the illuminating beam impinges on a scanning mirror from an off-axis direction (from a direction not along the central axis of the scan), and the mirror scans the beam across an angular range that is separated from the illuminating beam. This off-axis illumination forces the scanning mirror to work at large angles of reflection, leading to a highly distorted scan.

2. In the second architecture, the illuminating beam is directed to the scanning mirror via a beamsplitter. The beamsplitter reflects a part of the beam toward the scanning mirror, which in turn scans the beam across the angular range, with a part of the scanned beam passing through the beamsplitter to a target scene, for example. The use of a beamsplitter enables illuminating the mirror on-axis (along the central axis of the scan), thus avoiding large scan angles and the concomitant distortion. However, this architecture suffers from the optical power loss inherent in the double-pass use of a partially transparent beamsplitter.

Embodiments of the present invention that are described herein address these problems by providing a compact scanning device with on-axis illumination and a low optical power loss.

In a disclosed embodiment, a laser source emits a collimated beam, which impinges on a volume holographic grating (VHG). The VHG reflects the beam onto an adjacent scanning mirror along a direction that can be coincident with or otherwise close to the central axis of the scan, although alternatively, other beam angles can be used. (The central axis is typically an axis of symmetry for the scan.) The scanning mirror reflects and scans the beam over a range of scan angles, in one or two dimensions, wherein the reflected beam passes through the VHG.

The VHG is configured as a Bragg-grating so that it reflects only those beams that impinge on it at a specified Bragg-angle or within a narrow cone around this angle. The Bragg-grating is configured to have a sufficiently long interaction length to provide the desired selectivity in terms of wavelength and angular response; thus, only laser light addressing the grating from the correct angle and at the correct wavelength will be reflected by the VHG. The beam at all scan angles in the part of the scan range that is outside this narrow cone is transmitted with low loss through the VHG, as the angle of incidence is away from the grating Bragg-angle.

In the case that the scanner is also used for receiving a return beam (such as from a target scene), this beam traces the transmitted optical path in reverse, passing through the VHG to the scanning mirror and then reflecting from the scanning mirror and the VHG to a radiation detector. Thus, except for the narrow cone around the Bragg-angle, the scanner covers a large angular field of view (FOV) with minimal distortion and with minimal loss of optical power. The narrow wavelength selectivity provided by the Bragg-grating interaction also acts as a wavelength filter to inhibit ambient light from impinging upon the radiation detector, thus improving the sensitivity and range detection performance of the receiver.

FIGS. 1a-b are schematic top and side views, respectively, of an optical device 10, in accordance with an embodiment of the invention. Optical device 10 comprises a transmitter/receiver assembly 11, a VHG 14, a scanning mirror 16, and a controller 18. (Transmitter/receiver 11 and controller 18 are shown only in FIG. 1b for the sake of clarity).

A laser light source 12 in transmitter/receiver assembly 11 emits a collimated beam of light 28 at wavelength $\lambda$ and with a beam width shown by dotted lines 28a and 28b. (Beam 28, as well as the subsequent reflected and transmitted beams, are shown for clarity only in FIG. 1b). Beam 28 is incident on VHG 14, which is a Bragg-grating, configured to reflect beam 28 at wavelength $\lambda$ from an angle of incidence $\alpha$ to an angle of reflection $\beta$. In an example embodiment, the VHG is designed for a bandwidth of order<5 nm and an angular acceptance of <5 mrad FWHM, with typical reflectivity of 90-95%. Such a device typically requires a glass substrate with thickness of 0.5-2 mm. Taking the angles of incidence and reflection as positive angles, the Bragg-angle (external to VHG 14) is defined as $(\alpha+\beta)/2$. Any beam impinging on VHG 14 at an angle of incidence that differs from $\alpha$ by a small amount (for example, more than 0.5-1°, independently of the direction of propagation) is transmitted through the VHG. Conversely, any beam within this angle of difference from the Bragg-angle is reflected. The reflected beams are thus within a cone around the Bragg-angle, where the apex angle for the cone is for the above example 1-2°.

In the example embodiment, $\alpha=70°$ and $\beta=20°$, yielding a Bragg-angle of 45°, although VHG 14 may alternatively be configured for other Bragg-angles and other values of $\alpha$ and $\beta$ satisfying requirements of fabrication and optical geometry. The angles $\alpha$ and $\beta$, as well as the Bragg-angle $(\alpha+\beta)/2$, are defined by the internal structure of VHG 14. VHG Bragg-gratings with the sort of reflection and transmission properties described above are available commercially from a number of suppliers, for example, OptiGrate Corp. (Oviedo, Fla.).

In the example embodiment, scanning mirror 16 rotates around a vertical axis 15 through angles of rotation of ±15° in the top view of FIG. 1a and around a horizontal axis 17 through angles of rotation of ±10° in the side view of FIG. 1b, as shown by dotted lines 20 and 22, respectively. Angular extents 24 and 26 of the resulting FOVs are 60° in the horizontal direction (top view of FIG. 1a) and 40° in the vertical direction (side view of FIG. 1b).

VHG 14 reflects beam 28 into a reflected beam 30, which impinges on scanning mirror 16 and which has a beam width shown by dotted lines 30a and 30b. In the example shown in FIG. 1b, the axis of reflected beam 30 coincides with a central axis 19 of the scan (typically an axis of symmetry for the scan). Having the beam coincide with the central axis in this manner generally leads to the lowest possible distortion of the FOV. In alternative embodiments, however, reflected beam 30 may form a non-zero angle with respect to central axis 19.

Scanning mirror 16 reflects reflected beam 30 into an outgoing beam 32 and scans it across a range of angles as indicated above. Outgoing beam 32 has a beam width shown by dotted lines 32a and 32b. In FIG. 1b outgoing beam 32 is depicted at an angle of 20° with respect to central axis 19 (and reflected beam 30) due to reflection from scanning mirror 16 at a tilt angle of 10°. Due to the property of VHG 14 that only beams within a small cone containing the Bragg-angle (for example within 0.5-1° of reflected beam 30) are reflected by the VHG, outgoing beam 32 is transmitted through the VHG with a high transmittance, typically exceeding 90%.

When optical device 10 is used as shown in the figures to project a beam of light onto a target scene and to receive its reflection, a detector 33 in transmitter/receiver assembly 11 is utilized to sense the return beam. The beam of light returned from the target scene retraces the path of beams 32, 30, and 28: It is transmitted back through VHG 14 onto scanning mirror 16, reflected by the scanning mirror to the VHG and further reflected from the VHG by Bragg reflection toward detector 33. Due to the high reflectivity and transmittance described above, the overall light loss in optical device 10 is minimal.

In an alternative embodiment, referring to FIGS. 1a-b, the Bragg-grating is fabricated on the VHG substrate only in a limited beam area 34, in which beam 28 actually impinges on VHG 14, as this is the area in which high reflectivity is required for the impinging beam. Fabrication of the grating in a defined area is enabled by suitable masking in the process, as is known in the art.

Lines 36 in FIG. 1a and lines 38 in FIG. 1b, respectively, show the extent of beams reflected by scanning mirror 16, throughout its scan, towards the target scene, and their intercepts with VHG 14 mark the size of the substrate required for the VHG. However, the area of the substrate outside beam area 34 is only required to transmit beams, and consequently no Bragg-grating needs to be fabricated outside the beam area. In order to ensure maximal transmittance, an antireflection coating may be deposited on the substrate outside beam area 34, or possibly over the entire substrate. The edge of the Bragg-grating fabricated in beam area 34 may be apodized by a suitable masking so as to taper off radially the diffraction efficiency of the grating in order to avoid optical edge-effects.

In still another embodiment, again referring to FIGS. 1a-b, collimated beam 28 consists of short pulses. As described above, the return pulses are sensed by detector 33, and the corresponding signals, corresponding to times of arrival of the return pulses at detector 33, are output to controller 18. Controller 18 maps the distance to the target scene based on the round-trip time-of-flight of the pulses of light and the instantaneous angular position of the beam.

FIGS. 2a-b are schematic top views of, respectively, an optical device 100 and optical device 10, in accordance with another embodiment of the invention. Optical device 100 shown in FIG. 2a has a horizontal angular range of 110°, whereas optical device 10, described above with reference to FIGS. 1a-b (with FIG. 1a repeated as FIG. 2b) and shown here for comparison, has a horizontal angular range of 60°. In side view, optical devices 10 and 100 are identical, and these views are omitted for the sake of simplicity.

Optical device 100 comprises, similarly to optical device 10, a VHG 114 and a scanning mirror 116. Optical device 100 further comprises a transmitter/receiver assembly and a controller similar to those of optical device 10 as shown in FIG. 1b, but these are not shown in the top view of FIG. 2a for the sake of simplicity. Similarly to optical device 10, a central axis 119 and a beam area 134 are shown in FIG. 2a.

In the embodiment of FIG. 2a, scanning mirror 116 of optical device 100 rotates around a vertical axis 115 through angles of rotation of ±27.5°, as shown by dotted lines 120. An angular extent 124 of the resulting horizontal FOV is 110°, thus much wider than the horizontal FOV of 60° of optical device 10. Lines 136 show the horizontal extent of beams reflected by scanning mirror 116, throughout its scan, and their intercepts with VHG 114 mark the size of the substrate required for the VHG. A comparison of VHG 114 of FIG. 2a to VHG 14 of FIG. 2b shows that a much wider substrate is required for VHG 114.

FIG. 3 is a schematic representation of a FOV 150 of optical device 100, in accordance with the above described embodiment. FOV 150 is drawn as multiple vertical scan lines 152, such as scanning mirror 116 would generate. As the vertical scan of optical device 100 is identical to that of optical device 10, the vertical angular extent of FOV 150 is also 40°. The horizontal angular extent of FOV 150 is 110°, as was shown in FIG. 2a. The wide angular FOV is covered by optical device 100 with a low distortion, as demonstrated by the fact that even at vertical edges 154 of FOV 150, scan lines 152 deviate from straight vertical lines by only a minor amount. The low distortion is due to the fact that, similarly to optical device 10, scanning mirror 116 is illuminated along central axis 119.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical device, comprising:
   a laser light source configured to emit a collimated beam of light;
   a scanning mirror, which is configured to reflect and scan the beam of light over a predefined angular range; and
   a volume holographic grating (VHG), which is configured as a Bragg-grating so that it reflects only those beams that impinge on it at a predefined Bragg-angle, and which is positioned within the predefined angular range over which the scanning mirror scans the beam so that the VHG receives and reflects the collimated beam emitted by the laser light source toward the scanning mirror by Bragg reflection at the predefined Bragg-angle and so that the beam reflected from the VHG at the predefined Bragg-angle impinges on the scanning mirror along an axis that is contained within the predefined angular range over which the mirror scans the beam, while the beam reflected from the scanning mirror over a part of the predefined angular range over which the mirror scans the beam that is outside a cone containing the Bragg-angle is transmitted through the VHG toward a scene.

2. The optical device of claim 1, and comprising:
   a detector, which is configured to receive and sense the light that is returned from the scene through the VHG onto the scanning mirror, such that the returned light reflected by the scanning mirror reflects from the VHG by Bragg reflection toward the detector.

3. The optical device of claim 2, and comprising control circuitry, which is coupled to drive the laser light source and the scanning mirror and to receive a signal output by the detector in response to the reflected light impinging on the detector, and which is configured to map the scene responsively to the signal.

4. The optical device of claim 3, wherein the collimated beam of light comprises pulses of light, and wherein control circuitry is configured to determine a distance to the scene responsively to a time-of-flight of the pulses.

5. The optical device of claim 1, wherein an apex angle of the cone does not exceed 2°.

6. The optical device of claim 1, wherein the VHG is formed on a substrate and extends over only an area of the substrate where the collimated beam impinges on the substrate.

7. The optical device of claim 6, wherein the VHG is apodized.

8. A method for optical scanning, comprising:
   directing a collimated beam of light from a laser source toward a volume holographic grating (VHG), which reflects the beam at a predefined Bragg-angle toward a scanning mirror; and
   reflecting and scanning the collimated beam of light by the scanning mirror over a predefined angular range toward the VHG,
   wherein the VHG is configured as a Bragg-grating so that it reflects only those beams that impinge on it at the predefined Bragg-angle, and is positioned within the predefined angular range over which the scanning mirror scans the beam so that the VHG receives and reflects the collimated beam from the laser light source toward the scanning mirror by Bragg reflection at the predefined Bragg-angle and so that the beam reflected from the VHG at the predefined Bragg-angle impinges on the scanning mirror along an axis that is contained within the predefined angular range over which the mirror scans the beam, while the beam reflected from the scanning mirror over the part of the predefined angular range over which the mirror scans the beam that is outside a cone containing the Bragg-angle is transmitted through the VHG toward a scene.

9. The method according to claim 8, and comprising receiving and detecting the light that is returned from the scene through the VHG onto the scanning mirror, such that the returned light reflected by the scanning mirror reflects from the VHG by Bragg reflection toward a detector.

10. The method according to claim 9, and comprising mapping the scene responsively to a signal output by the detector in response to the reflected light impinging on the detector.

11. The method according to claim 10, wherein directing the collimated beam of light comprises emitting pulses of light, and wherein mapping the scene comprises determining a distance to the scene responsively to a time-of-flight of the pulses.

12. The method according to claim 8, wherein an apex angle of the cone does not exceed 2°.

13. The method according to claim 8, and comprising forming the VHG on a substrate, wherein the VHG extends over only an area of the substrate where the collimated beam impinges on the substrate.

14. The method according to claim 13, wherein forming the VHG comprises apodizing the VHG.

* * * * *